United States Patent [19]

Kitamura et al.

[11] Patent Number: 5,166,757
[45] Date of Patent: Nov. 24, 1992

[54] DRY-ETCHED AMORPHOUS SILICON DEVICE WITH RECESSED ELECTRODE

[75] Inventors: Koichi Kitamura; Hidenori Mimura; Kazuo Yamamoto; Yasumitsu Ohta, all of Kawasaki, Japan

[73] Assignee: Nippon Steel Corporation, Tokyo, Japan

[21] Appl. No.: 498,752

[22] Filed: Mar. 26, 1990

[30] Foreign Application Priority Data

Mar. 31, 1989 [JP] Japan .................................. 1-82586
Mar. 31, 1989 [JP] Japan .................................. 1-82587
Jun. 6, 1989 [JP] Japan .................................. 1-143630
Nov. 13, 1989 [JP] Japan .................................. 1-294689

[51] Int. Cl.$^5$ ...................... H01L 31/18; H01L 29/44
[52] U.S. Cl. .................................. 257/53; 250/370.01; 257/773
[58] Field of Search .................. 357/30, 52, 2, 68; 250/370.01

[56] References Cited

U.S. PATENT DOCUMENTS

| | | | |
|---|---|---|---|
| 3,154,692 | 10/1964 | Shockley | 357/52 |
| 4,385,200 | 5/1983 | Hamakawa et al. | 357/2 |
| 4,692,782 | 9/1987 | Seki et al. | 357/30 |

Primary Examiner—Jerome Jackson, Jr.
Attorney, Agent, or Firm—Steven M. Rabin

[57] ABSTRACT

A dry-etched amorphous silicon device which includes an amorphous silicon layer between upper and lower electrodes wherein the adverse effects of dangling silicon bonds on the periphery of the amorphous silicon layer are avoided by cutting back the peripheral surface of at least one of the electrodes to be radially inward of the peripheral surface of the amorphous silicon layer by at least one micron with respect to an axis of the device.

10 Claims, 11 Drawing Sheets

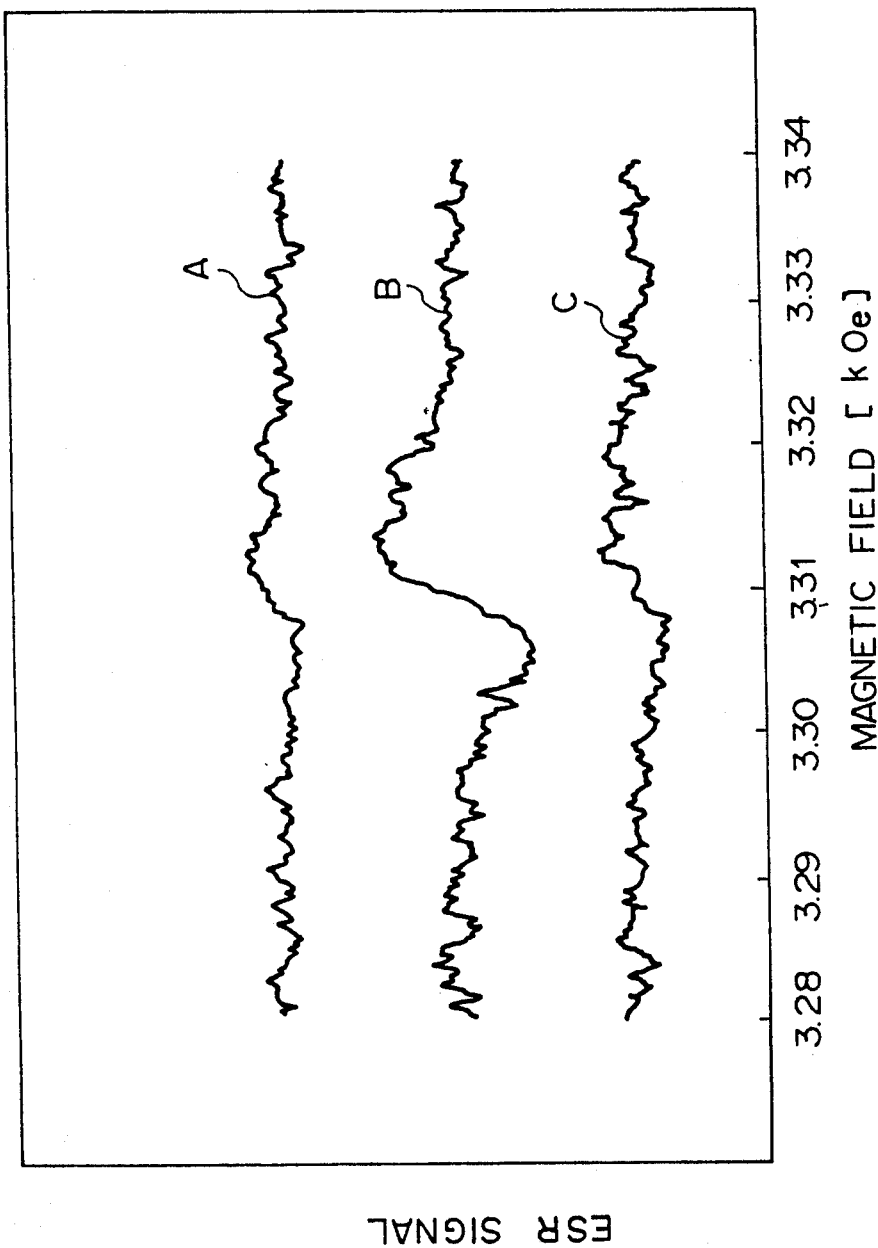

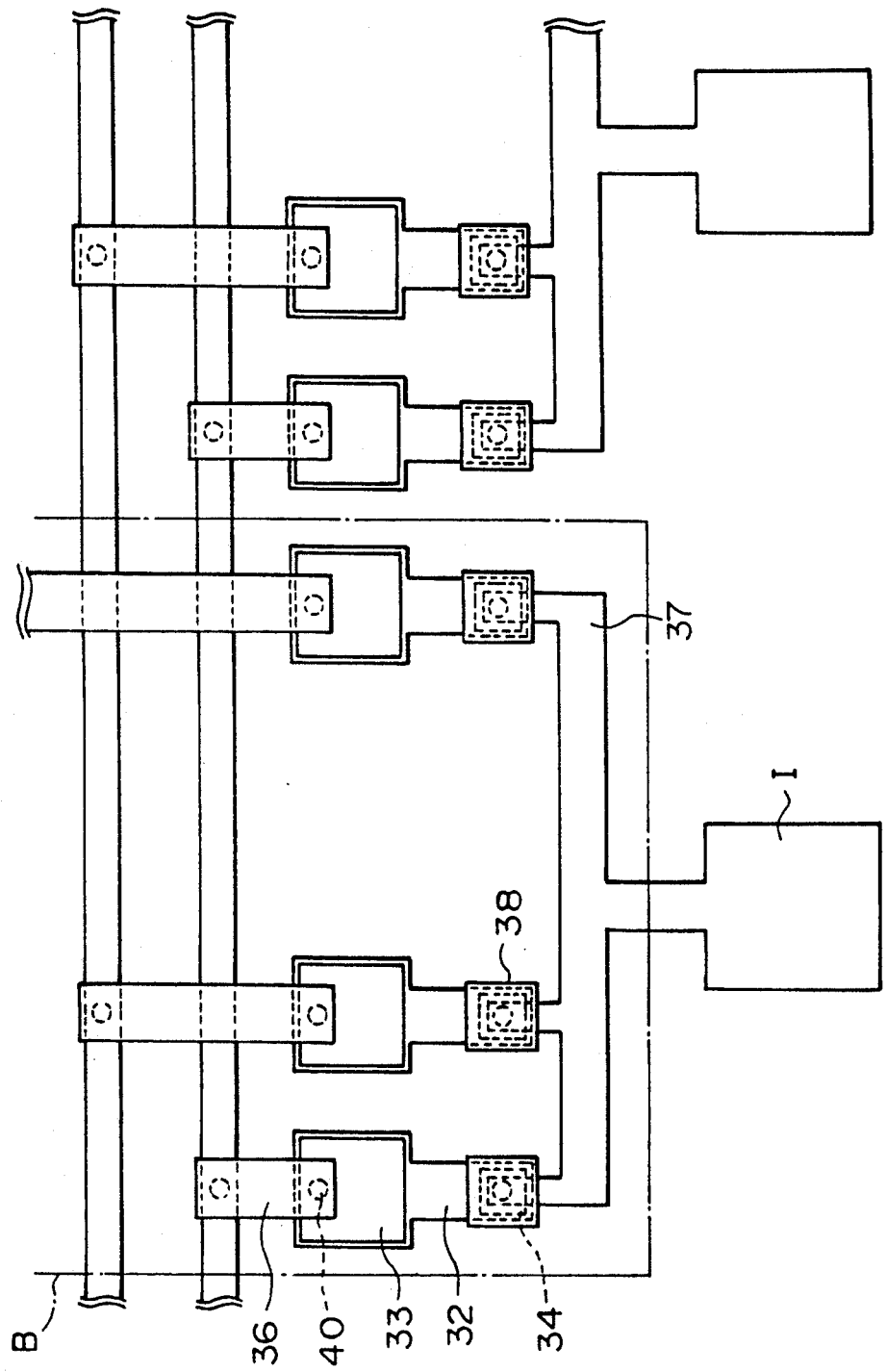

DRY-ETCHED AMORPHOUS SILICON DEVICE WITH RECESSED ELECTRODE

BACKGROUND OF THE INVENTION

1. Field of the Invention

The present invention relates to an amorphous silicon device and a method of dry etching an amorphous silicon device. More particularly, the present invention relates to a method of dry etching amorphous silicon in a dry etching process by which a fine-shaping process is carried out during the production of a thin film electronic device such as a diode or transistor, in which amorphous silicon is used as the thin film material, wherein deterioration of the electrical characteristics of the amorphous silicon channel portion due to exposure to an etching plasma or etching beam during the dry etching process is prevented, and thus the electrical characteristics are not substantially damaged even when a fine-shaping process indispensable to the formation of the device is applied, and an amorphous silicon device obtained therefrom.

2. Description of the Related Art

The process for forming an element having an electrical function, such as a diode or transistor, from a semiconductor electronic material such as a single crystalline silicon is called a device formation process.

In such a device formation process, the process of shaping of a single crystalline silicon semiconductor portion or the wiring metal portion of, for example, Al and Cr, is generally called "fine shaping".

In such fine shaping, the means for removing the material beneath the site not covered by the photoresist subjected to patterning may be broadly classified into (1) the wet etching method and (2) the dry etching method.

In the wet etching method the photoresist etching portion, i.e., the subbing material not covered by the photoresist, is removed by etching with a liquid etchant such as acid or alkali, and this method is widely utilized in the prior art. Nevertheless, in general, etching with such an etching treatment agent is isotropic (i.e., etching proceeds at the same rate in all directions), and thus this method is unsuitable when the pattern must be very fine or when the cut edge of the patterning portion is to be made vertical.

The dry etching method is a new process proposed in an attempt to solve the problems of the wet etching method as described above. In a typical example of this method, an etching gas such as $CF_4$ or $CCl_4$ is placed in a vessel under a low pressure, and using parallel plate type electrodes, a plasma is generated by a high frequency discharge, at a certain voltage, between these electrodes. The plasma contains fluorine-active species or chlorine active species, actively reactive with the subbing material, in large amounts, and therefore, the subbing material is etched at the photoresist etching portion. Here, by appropriately selecting the bias between the electrodes, the kind of gas, and the pressure of the gas, etc., anisotropic etching is possible, and this anisotropic etching is called RIE (i.e., reactive ion etching). As anisotropic dry etching methods other than this method, there are known the ion beam etching method in which ions or atoms of an inert gas are impinged against a substrate to physically or mechanically sputter the atoms of the substrate, and the reactive ion beam etching method in which ions or atoms of a reactive gas are irradiated on a substrate.

Using a dry etching method such as RIE, the subbing material can be finely and vertically etched only at the photoresist etching portion, and at the same time, the problem of undercutting arising in the wet etching method is solved. Therefore, the shaping of a very fine or complicated pattern becomes possible.

FIGS. 3(a)–3(c) show the patterning of a typical single crystal silicon by the wet etching method and by the dry etching method. The patterning by the dry etching method shown in FIG. 3(b) shows the single crystalline silicon 9 immediately below the photo-resist 1 shown in FIG. 3(a), which is subjected to vertical patterning, and the patterning by the wet etching shown in FIG. 3(c) shows the isotropic etching of the single crystalline silicon 9, and at the same time, the undercut 11 appears at the portion immediately below the photoresist 1 of the single crystalline silicon 9.

Also, since the dry etching method does not use a liquid etchant such as acid or alkali, the process is clean and compact and easily maintained. In addition, it becomes possible to etch a material which can be etched only with difficulty by the wet etching method (e.g., $Si_3N_4$) by using the dry etching method. Therefore, the dry etching method is now widely utilized in processing semiconductor materials, including typical single crystalline silicon.

In the dry etching method, however, since active species which are hyperactive are employed, the dangling bonds (i.e., unbonded arms of silicon) at the etching surface are increased, and consequently, a problem arises in that the electrical characteristics obtained by the dry etching method become poor. This is because an increase of the dangling bonds at the etching surface results in an etching surface which acts as an electroconductive channel, as shown in FIG. 4(a). Here, the problem is described using as an example an amorphous silicon diode having metal 10—p-type amorphous silicon 5—i-type amorphous silicon 4—n-type amorphous silicon 3—metal 10 layers formed, in this order, on the substrate 7, and the Figure shows that a defective (or electroconductive) channel portion 8 is formed on the surface of the diode etched by the dry etching method.

As a result, in an electronic device such as a diode and transistor, the off-current is increased, and thus it becomes a "leakable" device and presents a great problem in the preparation of a semiconductor device.

To solve the problems of the dry etching method, two typical methods have been proposed, in one of which the defective device is annealed in a nitrogen atmosphere at 500° C. or higher, or in a vacuum. Generally, this annealing is performed for several hours in a furnace, and reduces the dangling bonds at the defective channel portion as mentioned above, to reduce the off-current of the "leakable" device and thereby improve the electrical characteristics, as is widely known and used in the art for the formation of all semiconductor materials.

In another method, the channel portion with increased dangling bonds is removed by the wet etching method or the dry etching method. The channel portion, which was made defective during the etching process, exists under the exposed portion, and therefore, after the conventional etching process (namely, the etching process by which the defect is caused), anisotropic etching is effected to remove the channel portion. FIG. 4(b) shows the shape of the amorphous silicon diode from which the defective channel 8 has been removed.

These methods however, present difficulties when applied, because the problems as described below arise when the material to be shaped is an amorphous silicon.

First, in the annealing method, as well known in the art, the amorphous silicon contains a large amount of hydrogen in the form of Si—H, due to a low temperature non-equilibrium film formation, and this bond remarkably improves the electrical characteristics of the amorphous silicon (for example, reduction of localized level density). Nevertheless, the Si—H bond is easily destroyed by heat to release hydrogen when annealed at 300° C. or higher, whereby a problem arises in that the electrical characteristics become very poor.

The other method also has problems in the removing of the channel portion of the device. First, since the defective channel portion is formed during the dry etching process, even if an etching method which causes little damage is selected, it is very difficult in practice to achieve an ideal isotropic etching by cleanly removing only the defective channel portion without leaving defects on the freshly etched surface of the device. Also, since the isotropic etching process is very delicate, it is difficult to control and has a poor reproducibility. Therefore, the yield is low, and even within the same substrate, if the sizes of the etched portions are irregular, a problem arises in that variations of the characteristics of the elements occur.

For the reasons mentioned above, in the device using an amorphous silicon, an effective and improved method of forming the amorphous silicon channel portion by dry etching has not been found, and thus the degree of freedom of the design of the device structure and in the production process is very low.

SUMMARY OF THE INVENTION

Accordingly, the objects of the present invention are to eliminate the above-mentioned disadvantages of the prior art and to provide a novel dry etching method capable of solving the problems mentioned above, i.e., a method of dry etching amorphous silicon in a dry etching process by which a fine-shaping process is carried out in the production of a thin film electronic device comprising amorphous silicon as the thin film material, wherein the deterioration of the amorphous silicon channel portion due to exposure to the etching plasma or etching beam during the dry etching process is prevented, and the electrical characteristics are not damaged even when a fine-shaping process indispensable to the formation of the device is applied.

Another object of the present invention is to provide a method wherein the influence of the dangling bonds, generated during the production of a thin film electronic device such as a diode comprising an amorphous silicon as the material deposited on the device, is eliminated, and no deterioration of the characteristics of the device occurs even when dry etching is applied.

A further object of the present invention is to provide an amorphous silicon device having non-damaged electrical characteristics even when a fine-shaping process by dry etching is applied.

Other objects and advantages of the present invention will be apparent from the following description.

In accordance with the present invention, there is provided a method of dry etching an amorphous silicon device in a dry etching process by which a fine-shaping process is carried out during a production of a thin film electronic device in which an amorphous silicon is used as the thin film material, which comprises:

patterning a photoresist;

overetching an upper electrode by 1 μm or more on each side (i.e., the entire periphery side) having residual photoresist thereon, by using an isotropic etchant which selectively dissolves the material forming the upper electrode; and subsequently, anisotropically etching the amorphous silicon portion until it is the same size as the residual photoresist, by dry etching.

In accordance with the present invention, there is also provided a method of dry etching an amorphous silicon device in a dry etching process by which a fine-shaping process is carried out during a production of a thin film electronic device in which an amorphous silicon is used as the thin film material, which comprises:

patterning a photoresist;

etching an upper electrode, and anisotropically etching the amorphous silicon portion until it is the same size as the residual photoresist and the upper electrode, by dry etching; and then overetching a lower electrode by 1 μm or more on each side having the same residual photoresist thereon by using an isotropic etchant which selectively dissolves the material forming the lower electrode.

In accordance with the present invention, there is further provided a method of dry etching an amorphous silicon device in a dry etching process by which a fine-shaping process is carried out during a production of a thin film electronic device in which an amorphous silicon is used as the thin film, which comprises:

patterning a photoresist;

forming an amorphous silicon device by dry etching with active species generated in a gas phase; and annealing the amorphous silicon device at a low temperature of 80° to 300° C. for at least 10 to 60 minutes in an atmosphere.

In accordance with the present invention, there is further provided an amorphous silicon device having an amorphous silicon layer subjected to dry etching between an upper electrode and a lower electrode, wherein the periphery of at least one of said upper electrode and said lower electrode is radially inward by 1 μm or more from the periphery of said amorphous silicon layer.

BRIEF DESCRIPTION OF THE DRAWINGS

The present invention will be better understood from the description set forth below with reference to the accompanying drawings, in which:

FIG. 5 is a graph showing the increase in the dangling bonds at the dry etching surface of amorphous silicon and the decreasing effects of the dangling bonds according to the present invention, obtained by ESR determination;

FIG. 16 is a diagram showing a part of the connection pattern of the sensor element used in the contact type image sensor of the prior art.

DESCRIPTION OF THE PREFERRED EMBODIMENTS

Using examples of the amorphous silicon diode shown in FIG. 1(a)-(d), the details and mode of operations of the first embodiment of the present invention are described as follows.

Figure 1A:
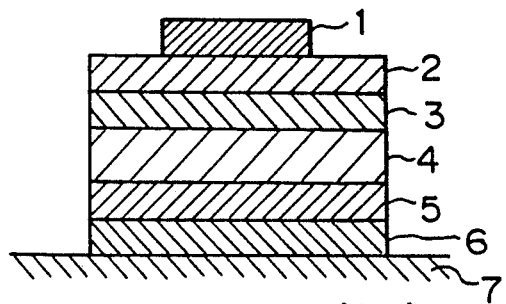
FIGS. 1(a)–(d) are schematic diagrams of the respective steps in an example of the first embodiment of the dry etching method of the present invention.
Figure 1B:
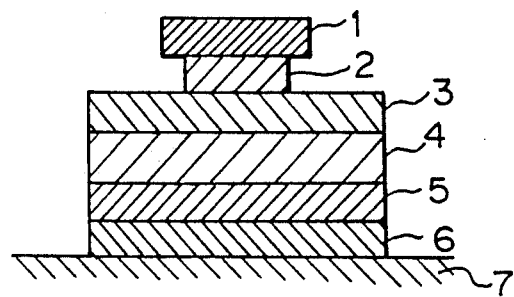

First, in the preparation of the amorphous silicon diode according to an example of the first embodiment, a laminate is formed on the substrate 7 (e.g., Corning 7059 glass substrate) of layers, in the order of a lower electrode 6 (e.g., made of Cr, Mo, Ta or MoTa)→p-type amorphous silicon 5→i-type amorphous silicon 4→n-type amorphous silicon 3→upper electrode 2 (e.g., made of indium tin oxide (ITO), $SnO_2$, Al, Cr, Mo, Ta or MoTa), a photoresist 1 (e.g., Shipley's Microposit is formed on the upper electrode 2, and the photoresist 1 is patterned to a desired shape. FIG. 1(a) shows the diode cross-section after the patterning of the photoresist on the upper electrode 2. Next, using the residual photoresist 1 as a mask, the upper electrode 2 is isotropically etched by an etchant which selectively dissolves the upper electrode 2. As an etchant, any conventional etchant can be used. The typical example of such an etchant is a mixture of hydrochloric acid and nitric acid. FIG. 1(b) shows the diode crosssection after completion of this etching. Note, the important feature is the overetching by 1 $\mu$m or more, preferably 1 to 2 $\mu$m, on each side of the upper electrode 2. Namely, in FIG. 1(b), the width of the upper electrode 2 is made smaller by 2 $\mu$m or more, preferably 2 to 4 $\mu$m, on each side, than the width of the residual photoresist 1.

Figure 1C:
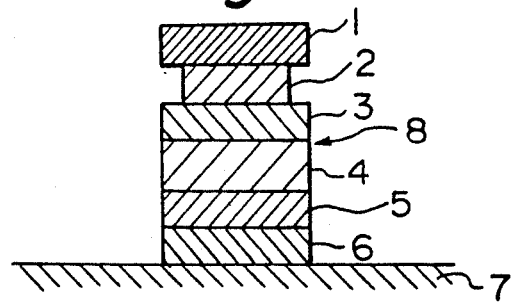

Then, the amorphous silicon portion (i.e., p-type amorphous silicon 5, i-type amorphous silicon 4, and n-type amorphous silicon 3) is anisotropically etched by RIE. In this case, the upper electrode 2 on the amorphous silicon portion is smaller than the photoresist 1, but since the etching of the amorphous silicon is anisotropic and the thickness of the upper electrode is sufficiently thin, the width of the amorphous silicon becomes substantially equal to that of the photoresist 1, as shown in FIG. 1(c). In the anisotropic etching, a defective (or electroconductive) channel portion 8 is formed on the etched surface of the amorphous silicon portion, because it is exposed to the etching plasma or etching beam during the drying etching process.

Figure 1D:
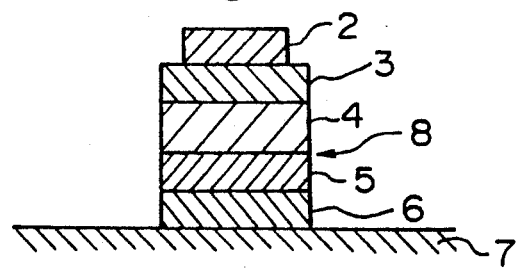

Finally, the lower electrode 6 is patterned by etching, if necessary, and after the photoresist 1 is removed, the formation of the amorphous silicon diode according to the present invention is completed as shown in FIG. 1(d).

In the dry etching method of the present invention, as shown in FIG. 1(d), since the upper electrode 2 does not overlap the defective (or electroconductive) channel portion 8 of the amorphous silicon formation formed during the drying etching process, the electrical characteristics of the amorphous silicon diode are not affected by the defective (or electroconductive) channel portion. This is based on the fact that, in an amorphous silicon diode, a voltage is externally applied to the amorphous silicon portion only at the portion sandwiched between the upper and lower electrodes 2 and 6 (overlapping the upper and lower electrodes) and only that portion is actuated as a diode. The gist of the present invention resides in the overetching of at least one of the upper and lower electrodes 2 and 6 to a width less than the width of the defective (or electroconductive) channel 8 in the amorphous silicon portion, that is, to overlap only the nondefective portion of the amorphous silicon layer which is surrounded by the channel 8. Accordingly, the amorphous silicon diode shown in FIG. 1(d) acts electrically in the same way as a diode having an amorphous silicon portion not characteristically defective and having exactly the same size as the upper electrode 2 subjected to overetching.

In the first example described above, the overetching of the upper electrode has been described. According to the second example of the first embodiment, the same mode of operation can be obtained by making the upper electrode the same size as the amorphous silicon portion, and overetching the lower electrode to make it smaller than the amorphous silicon portion.

In the present invention, the amount of overetching must be larger than the thickness of the defective (or electroconductive) channel portion of the amorphous silicon portion formed by dry etching, and in this sense, overetching by an amount corresponding to 1 $\mu$m or more, preferably 1 to 2 $\mu$m, on each side of the amorphous silicon portion is required at the upper electrode or the lower electrode. If the overetching amount is 1 $\mu$m or less, the influence of the defective (or electroconductive) channel portion remains, and thus the effect of the present invention is lost. On other hand, if the overetching amount greatly exceeds 1 $\mu$m, although the effect of the present invention remains, the effective area of the device becomes smaller, and therefore, this is not a good countermeasure.

According to the second embodiment of the present invention, the deteriorated electrical characteristics due to the dry etching can be restored only by simply annealing the electrically deteriorated amorphous silicon at a very low temperature e.g., 80° to 300° C., preferably 90 to 200° C., for a short period of time, e.g., 10 to 60 minutes, even in an atmosphere. When the annealing temperature is less than 80° C., a substantial restoration of the deteriorated electric characteristics is not obtained even by effecting annealing for a long time, e.g., more than one hour. Contrary to this, when the annealing temperature is more than 300° C., the Si—H bonds in the amorphous silicon are broken, to thereby increase the dangling bonds. Generally speaking, the annealing time may become shorter with the increase of the annealing temperature and the required longer time with the reduction of the annealing temperature. For example, the annealing time is about 10 minutes at an annealing temperature of 300° C. whereas the annealing time must be about 30 minutes, even at an annealing temperature of 80° C., to obtain a sufficient restoration of the electrical characteristics. The annealing can be, of course, carried out for a longer time.

Furthermore, since a short time annealing is effected at a low temperature according to the present invention, the treatment is very simple and reproducible, when compared to the prior method for removing the defective channel by anisotropic etching. In addition, the present invention is advantageous in that the shape of the device formed by the dry etching is not changed.

Thus, according to the second embodiment of the present invention, it was first attempted to apply the annealing treatment at a low temperature for a short period of time in an air atmosphere to the defective channels of amorphous silicon, to improve the electrical characteristics, and as a result, satisfactory effects have been unexpectedly obtained.

The amorphous silicon device according to the present invention can be advantageously applied to an image sensor for a small-scale facsimile, particularly to a contact type image sensor by which an original can be read without reducing same.

A contact type image sensor which can read an original, without using a reducing optical system, has a short optical path length, and therefore, the size of the device can be made smaller, and accordingly, it is utilized widely as a reading device for a small scale facsimile and bar code reader, etc.

Figure 15:
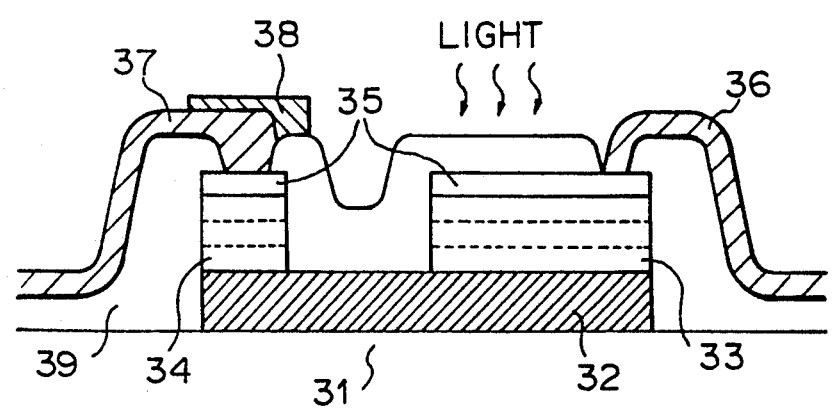
FIG. 15 is a schematic structural illustration of the sensor element of the contact type image sensor of the prior art.

FIG. 15 is a schematic sectional view of the sensor element of the contact type image sensor of the prior art. In FIG. 15, 31 is a glass substrate having a lower electrode 32 on the upper surface thereof, wherein the right end side of the lower electrode 32 is provided with a pin structure photodiode (PD) 33, and the left end side thereof is provided with a blocking diode (BD) 34 having the same structure. A PD upper electrode 36 is bonded to the upper part of the photodiode 33 through a transparent electroconductive film 35 such as ITO (i.e., Indium Tin Oxide). Similarly, a BD upper electrode 37 is bonded to the upper part of the blocking diode 34 through the transparent electroconductive film 35. Also, a light-shielding layer 38 is formed at the upper part of the BD upper electrode 37, to shield the blocking diode 34, and 39 is an insulating layer for insulation between the sensor elements.

FIG. 16 shows a part of the connection pattern of the sensor elements used in the contact type image sensor of the prior art, formed as a matrix connection. As shown in FIG. 16, the BD upper electrode 37 connected to the blocking diode 34 is a comb type, and the respective diodes 33 and 34 are electrically connected, by a through hole 40 formed in the insulating layer, to the respective upper electrodes 36 and 37.

According to the constitution as described above, the light from an original enters a number of photodiodes 33 connected in a matrix, is photoelectrically converted by the photodiodes, and is accumulated as charges corresponding to the dose. The accumulated charges are derived by sending successive pulses to the respective blocking diodes 34, which are switching elements, through the input contact portion I, to thereby successively turn the respective blocking diodes 34 ON for an external read out. The degree of integration of the sensor elements of such a contact type image sensor can be improved, since the photoelectric converting elements constituting the sensor element and the switching element are constituted of diodes having the same structure, and has an advantage in that it can be easily produced.

When the light from an original enters the blocking diode 34, when reading the original with a contact type image sensor, a current is passed through the blocking diode 34 due to the incident light. This current is merged with the signal current due to the incident light in the photodiode 33 and they are then inseparable, and therefore, when the light from the original enters the blocking diode 34, the read image will be blurred. Accordingly, in the contact type image sensor of the prior art, to prevent the entry of incident light from the original, a light-shielding layer 38 is formed at the upper part of the blocking diode 34 as shown in FIG. 15. Thus, in the contact type image sensor of the prior art, to prevent the entry of incident light from the original to the blocking diode 34, the light-shielding layer 38 and the step of forming the light-shielding layer 38 are required, and thus a drawback of high production costs arises. However, when the above-prepared amorphous silicon device is used in the structure of the contact type image sensor of the prior art, a contact type image sensor which can be obtained by a simplification of the production steps, and can prevent the entry of incident light from an original to the blocking diode, can be advantageously provided.

Furthermore, according to the present invention, a contact type image sensor having a sensor element comprising a photodiode, which converts optical signals from an original to electrical signals corresponding to the intensity of light, and a blocking diode which functions as the switching element for reading the information accumulated in said photodiode is provided, wherein the electrode provided on the surface of said blocking diode opposed to said original is formed so as to cover the whole of said surface of said blocking diode and the above-mentioned amorphous silicon device is advantageously utilized.

The contact type image sensor according to the present invention has electrodes formed on the surface of the blocking diode opposed to an original so as to cover the whole surface thereof, and therefore, the entry of incident light from the original to blocking diode can be prevented. Also, the incident light entering the blocking diode is shielded by the electrodes and a light shielding layer of the contact type image sensor of the prior art is not required, whereby a simplification of the production steps is effected.

EXAMPLES

The present invention will now be further illustrated by, but is by no means limited to, the following Examples.

EXAMPLE 1

This is an Example of the present invention when used for the formation of an amorphous silicon diode as shown in FIGS. 1(a)–(d).

The diode was prepared, as shown in FIG. 1(a), by first successively depositing, on a glass substrate 7, Cr as the lower electrode 6 to 2000 Å, a p-type amorphous silicon 5 to 300 Å, an i-type amorphour silicon 4 to 6000 Å, a n-type amorphous silicon 3 to 300 Å, and ITO as the upper electrode 2 to 600 Å, followed by patterning to a size of 100 μm×125 μm to form a photoresist 1, wet etching the ITO as the upper electrode, as shown in FIG. 1(b), by using the photoresist 1 as a mask, and subsequently, dry etching the amorphous portion (i.e., p-type amorphous silicon 5, i-type amorphous silicon 4 and n-type amorphous silicon 3) as shown in FIG. 1(c), with $CF_4$.

Figure 2:
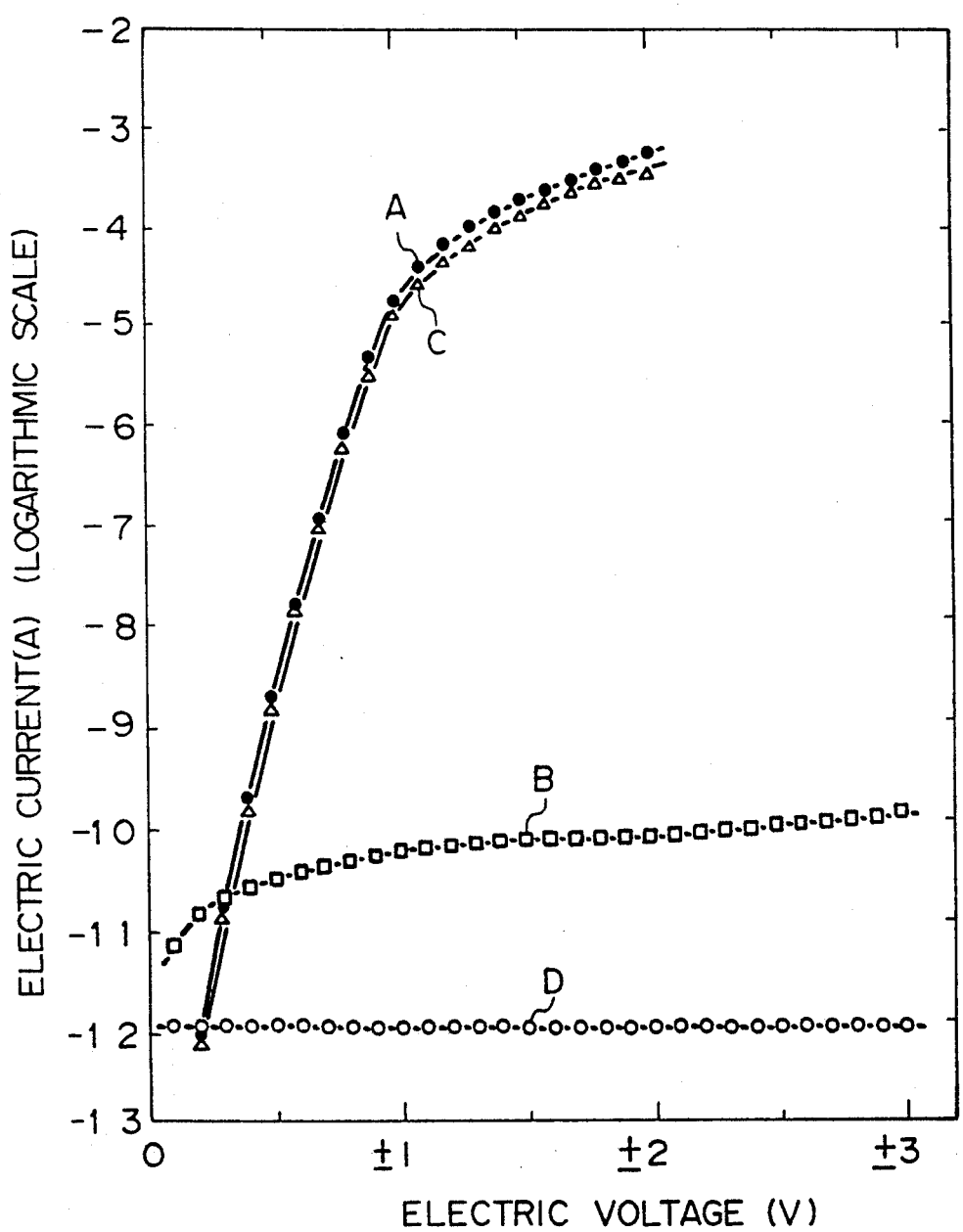
FIG. 2 is a graph showing the deterioration of the voltage-current characteristic due to dry etching of the amorphous silicon diode, and the manner of characteristic restoration practiced by the present invention.
Figure 3A:
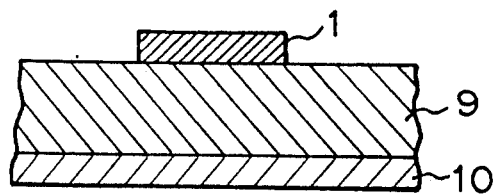
FIGS. 3(a)–(c) are schematic sectional views showing the patterned shapes of typical single crystalline silicon formed by the wet etching method and the dry etching method of the prior art.
Figure 3B:
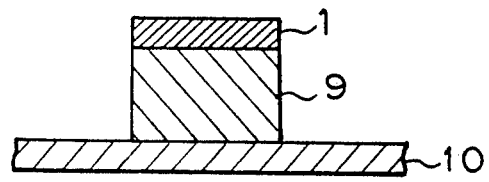
Figure 3C:
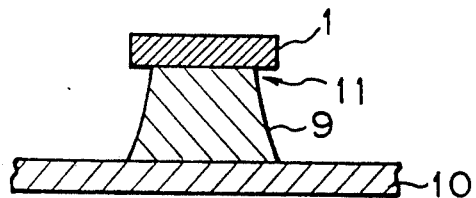
Figure 4A:
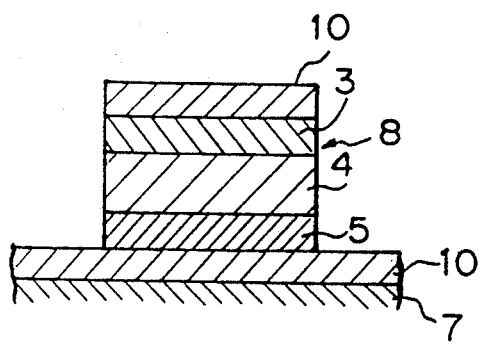
FIGS. 4(a)–(b) are schematic sectional views showing the defective channel of the amorphous silicon diode formed by the dry etching method of the prior art, and the channel removal by isotropic etching.
Figure 4B:
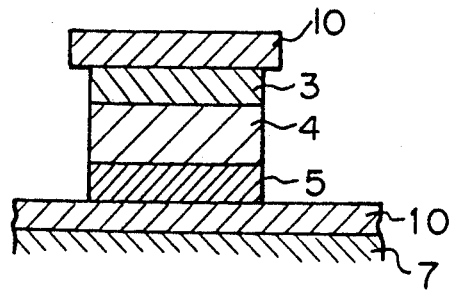

FIG. 2 shows the voltage-current characteristics of these diodes.

In FIG. 2, the curve A shows the normal direction characteristics of the blocking diode and the curve B shows the reverse direction characteristics of the same blocking diode. As is clear from this graph, since the reverse direction characteristics have become "leakable" due to the dry etching, the rectifying ratio is not favorable at $10^6$.

In contrast, the normal direction characteristics of the diode in which the ITO was overetched as an example of the present invention become as shown by the curve C in FIG. 2, while the reverse direction characteristics become as shown by the curve D in FIG. 2. It is clear that the present invention greatly improves the reverse direction characteristics while maintaining good normal direction characteristics, and that the rectifying ratio has been improved to about $10^8$.

As the etchant for the ITO, which is the upper electrode in this Example, a mixture of hydrochloric acid and nitric acid was used. The etching time was about 3 minutes in the case of etching and about 15 minutes in the case of overetching, and the etchant was kept at 25° to 30° C.

As described above, according to the first embodiment of the present invention, the problem of defective channeling in the amorphous silicon etching surface during the dry etching process, which has been a problem in the amorphous silicon device of the prior art, can be solved. The present invention is an epoch-making method which does not anneal or etch away the defective channel portion of the prior art. Also, since the present invention can overetch the electrode portion, which is indispensable, no special process or device is required, and therefore, this method is low cost and simple. Also, according to the present invention, the electrical characteristics before dry etching can be restored without changing the shape of the defective channel portion, and thus the degree of freedom of the structure design and the production process of the amorphous silicon device are improved.

EXAMPLE 2

Figure 7:
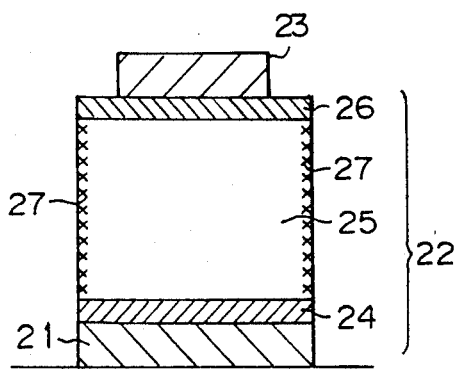
FIG. 7 is a sectional view of an amorphous silicon device which is a first example of the present invention.

FIG. 7 is a sectional view of an Example of the present invention, wherein 21 is a lower electrode comprising a metal such as chromium, 22 is a semiconductor layer of amorphous silicon, and 23 is an upper electrode comprising a transparent electroconductive film such as ITO (Indium Tin Oxide). The amorphous silicon layer 22 further comprises a p-type amorphous silicon layer (p-type a-Si) 24, an i-type amorphous silicon layer (i-type a-Si) 25, and a n-type amorphous silicon layer (n-type a-Si) 26. Therefore, the device shown in FIG. 7 acts as a diode.

The amorphous silicon layer 22 in FIG. 7 is formed by laminating the respective layers successively from below, and etching same to provide a vertical cut edge.

Accordingly, dangling bonds of silicon are increased on the etched surface of the i-type amorphous silicon layer 25, the insulation of which should be maintained, to thereby form an electroconductive channel 27, and when an unnecessary off-current passes through the channel 27, the electrical characteristics of the device will be deteriorated.

When, however, the ITO 23 which forms the upper electrode is made smaller toward the innerside thereof by 1 μm or more from the end of the amorphous silicon layer 22, i.e., its peripheral surface is radially inward of the peripheral surface of the silicon layer 22 with respect to the axis X by 1 μm or more, the ITO 23 does not overlap the portion where the channel 27 is formed, and therefore, the channel 27 has no influence on the electrical characteristics of the amorphous silicone diode. This is because, in the amorphous silicon diode, the external voltage is applied only to the amorphous silicon layer between the upper electrode and the lower electrode, and thus only this portion is actuated as a diode.

The present applicant proposed a method of forming an amorphous silicon device similar to that shown in the above-mentioned FIG. 7. The method of the present invention comprises forming an upper electrode, and then making the upper electrode smaller by 1 μm or more from the end of the amorphous silicon layer. The effect of the amorphous silicon device obtained according to the method of the above-mentioned invention is the same as that of the present invention, but the amorphous silicon device of the present invention also includes the effects obtained by initially making the upper electrode smaller than the amorphous silicon layer.

Figure 8:
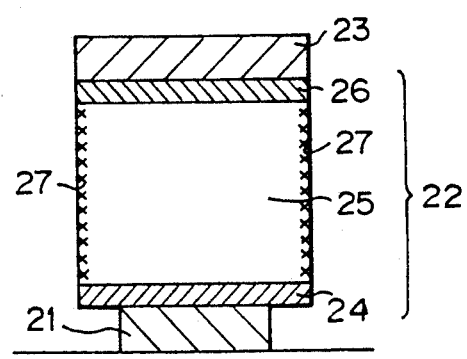
FIG. 8 is a sectional view of the amorphous silicon device which is a second example of the present invention.

FIG. 8 is a sectional view of another example of the present invention. In this Example, different from the case of FIG. 7, the ITO 26 has the same size as the amorphous silicon layer 22, and the lower electrode 21 is made smaller toward the innerside thereof by 1 μm or more, from the end of the amorphous silicon layer 22. Therefore, also in this case, no voltage is externally applied to the channel 27, whereby a deterioration of the electrical characteristics of the device can be prevented as in the case of the first example.

Figure 9:
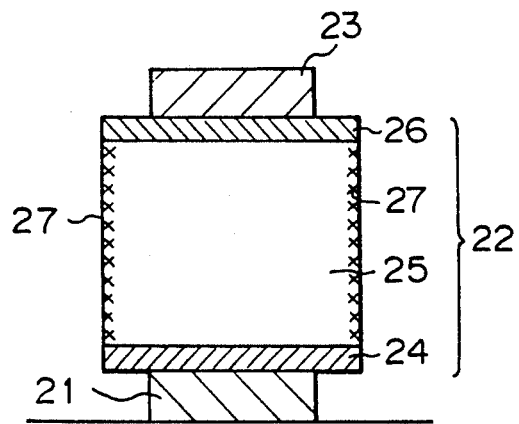
FIG. 9 is a sectional view of the amorphous silicon device of a third example of the present invention.

FIG. 9 is a sectional view of a third example of the present invention. In this example, the lower electrode 21 and the ITO 23 are both made smaller by 1 μm or more from the end of the amorphous silicon layer 22. Therefore, also in this case, no external voltage is applied to the channel 27, whereby a deterioration of the electrical characteristics of the device can be prevented.

In FIGS. 7, 8, and 9, either the lower electrode 21 or the ITO 23 is made smaller by 1 μm or more from the end of the amorphous silicon layer 22, i.e., its peripheral surface is radially inward of the peripheral surface of the silicon layer 22 with respect to the axis X by 1 μm or more, but if less than 1 μm, the influence of the channel 27 remains and the effect of the present invention is lost. On the other hand, if the lower electrode 21 or the ITO 23 is made much smaller, greatly in excess of 1 μm from the end of the amorphous silicon layer 22, the effective area of the device will be undesirably reduced.

Figure 10:
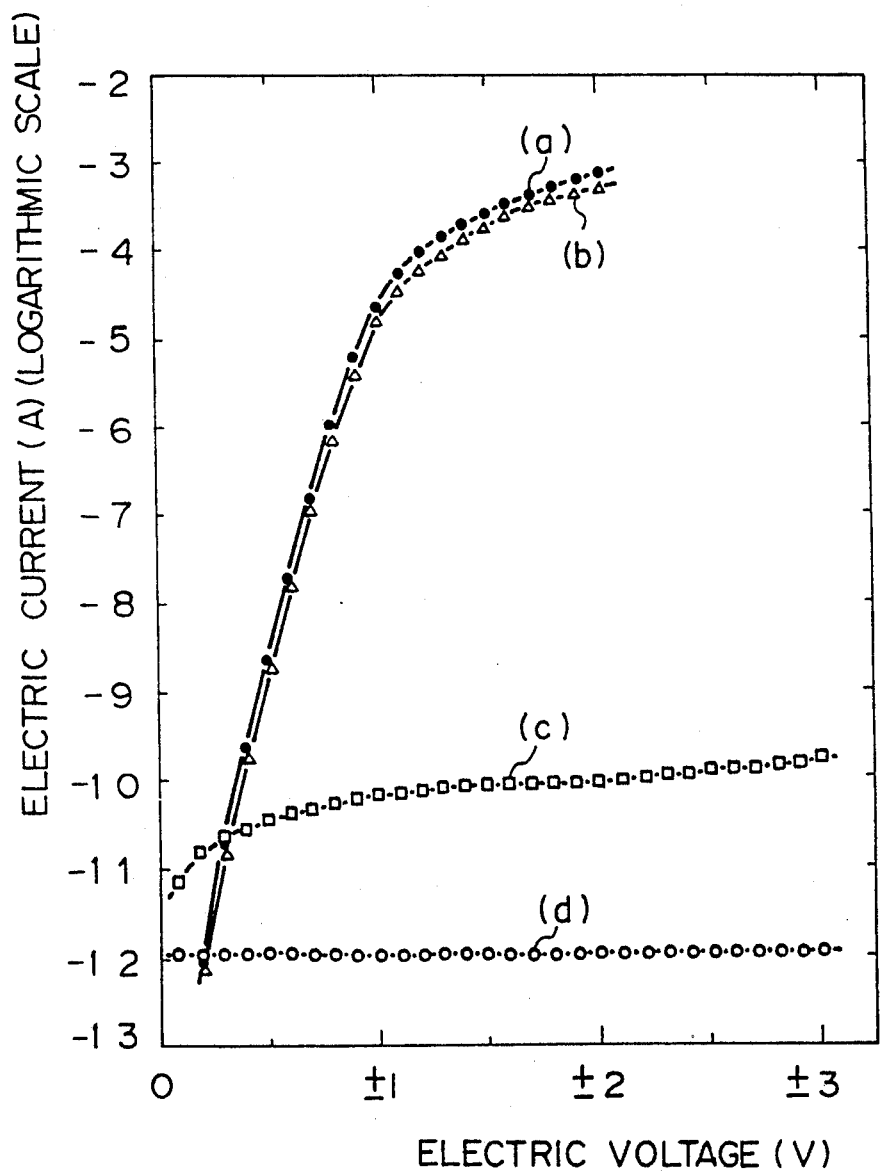
FIG. 10 is a graph showing the manner of characteristic restoration by dry etching of the amorphous silicon diode in the present invention.

For comparison, a diode having the prior art structure entirely the same as described above, except that the ITO 23, which is the upper electrode, is the same size as the amorphous silicon layer, was separately prepared. FIG. 10 shows the voltage-current characteristics of these diodes.

FIG. 10 (a) is the normal direction characteristic of the diode for comparison, and FIG. 10 (c) is the reverse direction characteristic of the diode for comparison. As is clear from these characteristic curves, at a reverse direction voltage of 2 volts ($-2$), a current of $10^{-10}$ ampere flows through the comparative diode. That is, the dry etching has made the reverse direction characteristic "leakable", whereby the rectifying ratio is unfavorably about $10^6$.

In contrast, the normal direction characteristic of the diode of one example of the present invention becomes as shown in the same FIG. 10 (b), and the reverse direction characteristic as shown in the same FIG. 10 (d). As can be seen from these characteristic curves, the diode of the present invention can have a greatly improved reverse direction characteristic with the current flowing at a reverse direction voltage of 2 volts ($-2$) being lowered to $10^{-12}$, while maintaining a good normal direction characteristic, and the rectifying ratio is improved to about $10^8$.

As described above, according to the present invention, since at least one of the upper electrode and the lower electrode is made smaller by 1 $\mu$m or more from the end of the amorphous silicon layer, no off-current due to the influence by the channel formed on the surface portion of the amorphous silicon layer by dry etching will flow, and an amorphous silicon device which can effectively prevent a deterioration of electrical characteristics of the device can be provided.

EXAMPLE 3

The second embodiment of the method of dry etching an amorphous silicon device is now described with reference to the drawings.

FIG. 5 illustrates the determination results of ESR (i.e., "Electron Spin Resonance") showing the increase in the dangling bonds at the etching surface of amorphous silicon due to a dry etching. In FIG. 5, the height of the wave peak of the sine wave appearing at 3.31 KOe in the abscissa axis corresponds to the number of the dangling bonds. The samples used in this Example are those in which i-type amorphous silicon was deposited on a silica glass substrate having a size of 20 mm $\times$ 20 mm.

As is clear from FIG. 5, the signals representing the existence of the dangling bonds were very small, and the wave peaks of the ESR were not substantially detected in the sample after the deposition (see curve A). Since the detecting limit of the ESR units used was $10^{16}$ cm$^{-3}$, the number of the dangling bond was shown to be very small. Then, the surface of the deposited sample was dry etched with CF$_4$ (i e., RIE method) by about 3000 Å. The ESR signals of the resultant sample are shown in the curve B of FIG. 5. As is clear from the curve B, the number of the dangling bonds was remarkably increased by the dry etching. The dry etched sample was then subjected to an annealing treatment according to the present invention at a temperature of 90° C. for 20 minutes in an air atmosphere. As a result, as shown in the curve C of FIG. 5, the number of the dangling bonds was again decreased and the defective channels were better than those after the deposition of the i-amorphous silicon.

The second embodiment of the present method was applied to the formation of an amorphous silicon diode similarly as shown in FIG. 1.

The diode was prepared by successively depositing, on a glass substrate, a metal (Cr) to 2000 Å, a p-type amorphous silicon to 300 Å, an i-type amorphous silicon to 6000 Å, an n-type amorphous silicon to 300 Å, and a metal (ITO) to 600 Å, followed by patterning to a size of 100 $\mu$m $\times$ 125 $\mu$m by dry etching with CF$_4$ (RIE).

Figure 6:
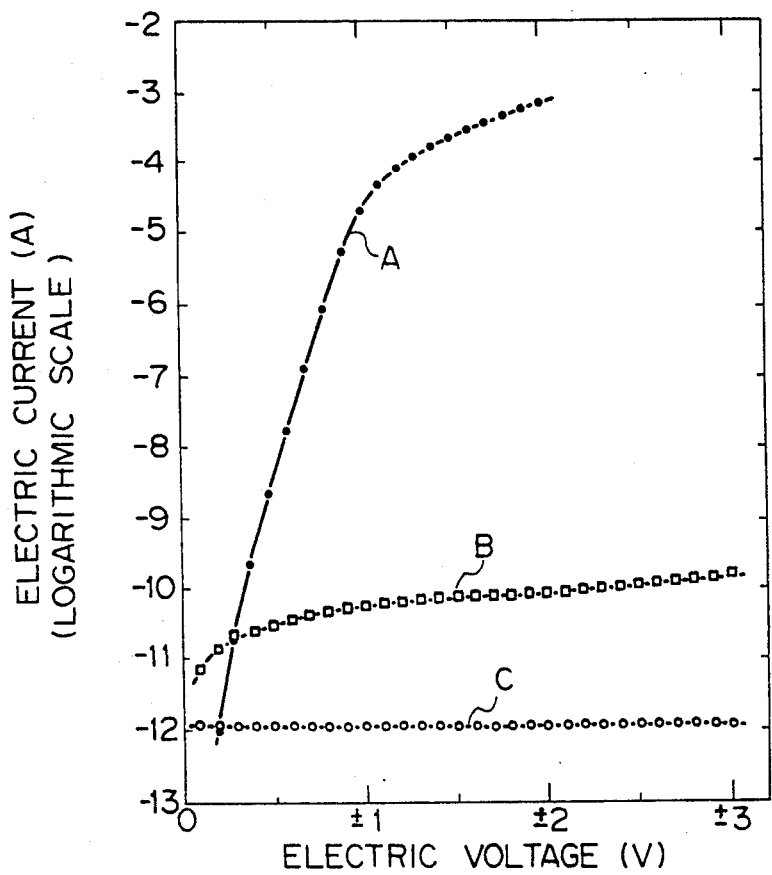
FIG. 6 is a graph showing the deterioration of the voltage-current characteristic due to dry etching of the amorphous silicon diode and the manner of characteristic restoration practiced by the present invention.

The voltage-current characteristics of the diode are shown in FIG. 6. In FIG. 6, the curve A shows the normal direction characteristics of the diode and the curve B shows the reverse direction characteristics of the diode after dry etching. As is clear from this graph, since the reverse direction characteristics have become "leakable" due to the dry etching, the rectifying is not favorable at $10^6$.

In contrast, when the diode was subjected to the annealing treatment according to the present invention at a temperature of 90° C. for 20 minutes in an air atmosphere, the reverse direction characteristic was remarkably improved as shown in curve C in FIG. 6. The rectifying ratio has been improved to about $10^8$.

As described above, according to the second embodiment of the present method, the problem of defective channeling in the amorphous silicon etching surface during the drying etching process, which has been a problem in the amorphous silicon device of the prior art, can be solved. Also, since the present method is a very simple method in which the annealing treatment is carried out at a low temperature for a short time in an air atmosphere, the present method is applicable to any types of amorphous silicon devices and the necessary apparatus cost is low because only a low temperature atmospheric oven is required. Furthermore, according to the present invention, since the electrical characteristics prior to the dry etching can be restored without changing the shape of the defective channels, the degree of freedom of the structural design and the production process of the amorphous silicon device are remarkably improved.

EXAMPLE 4

Figure 11:
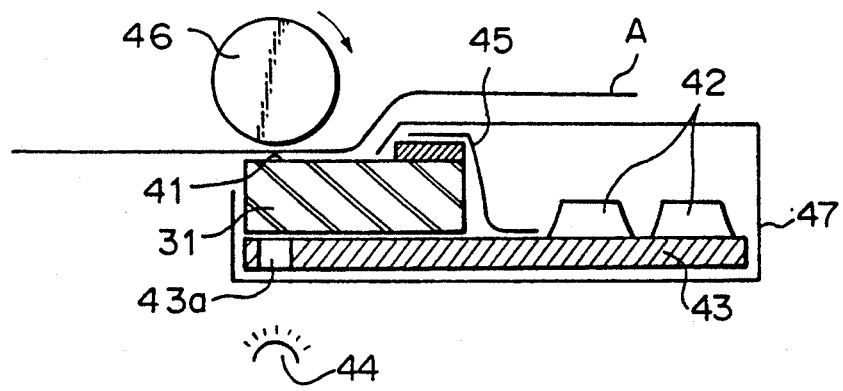
FIG. 11 is a schematic sectional view of the contact type image sensor which is an embodiment of the present invention.
Figure 12:
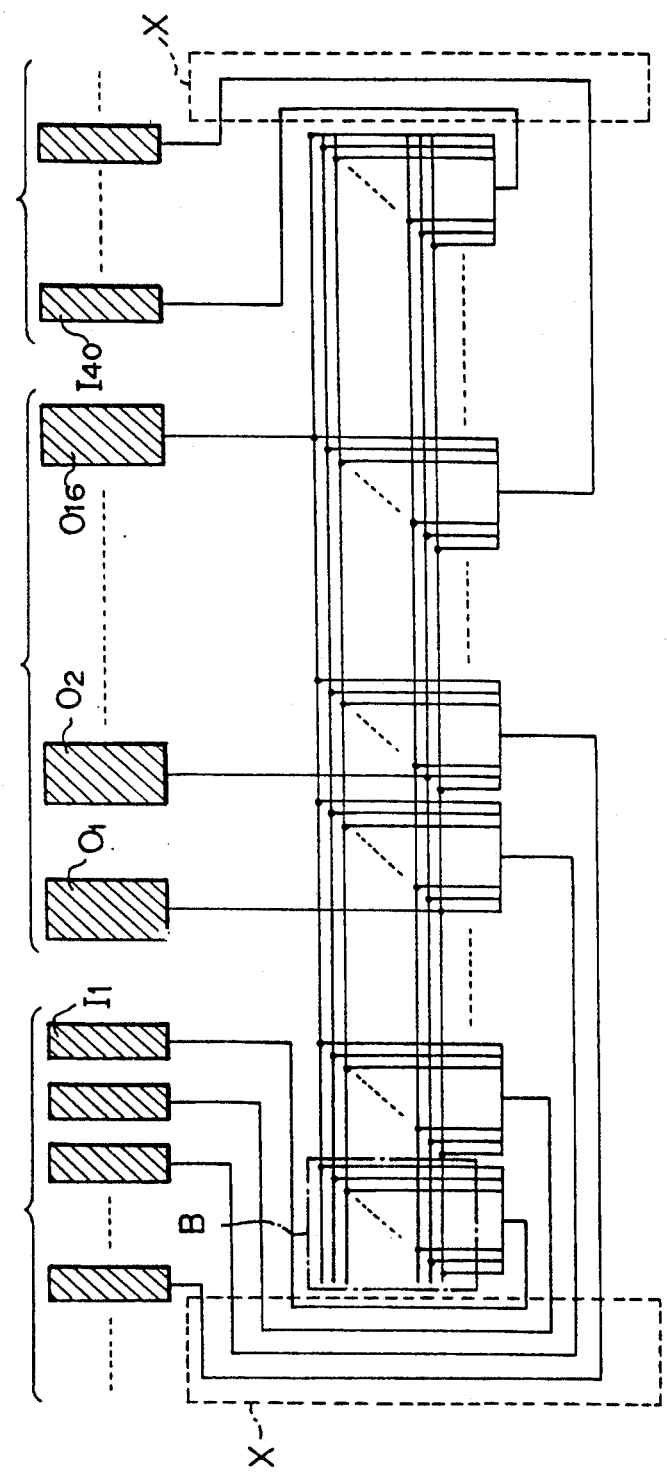
FIG. 12 is a schematic connection diagram thereof.

An Example of the contact type image sensor, in which the amorphous silicon device of the present invention is used, is now described with reference to FIG. 11 through FIG. 14. FIG. 11 is a schematic sectional view of the contact type image sensor, which is the second embodiment of the present invention. In FIG. 11 and FIG. 12, 31 is a glass substrate made of a light-transmissive material such as glass, and has a sensor element 41 provided at one side end thereof and an input contact portion I and an output contact portion 0 formed on the other side end. At the back of the glass substrate 31 is arranged a circuit substrate 43 having an IC 42 for driving the sensor element 41 mounted thereon, and further, a light source 44 is arranged below the circuit substrate 43. Also, 43a is a slit through which the light from the light source 44 is transmitted, 45 is a heat pressure adhered electroconductive seal for connecting the contact portions I.O and the IC 42 for driving, 46 is a roller for pushing the original A against the sensor element 41, and 47 is a holder.

Figure 13:
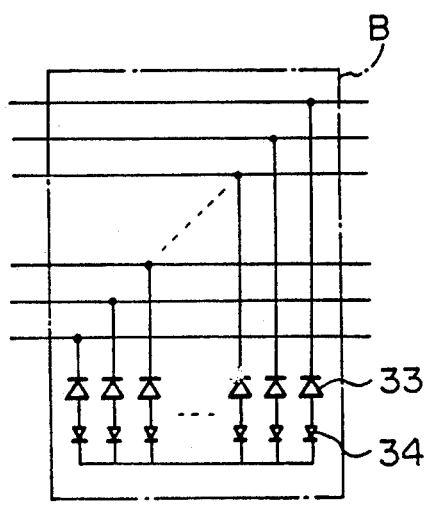
FIG. 13 is a detailed diagram of the sensor block.
Figure 14:
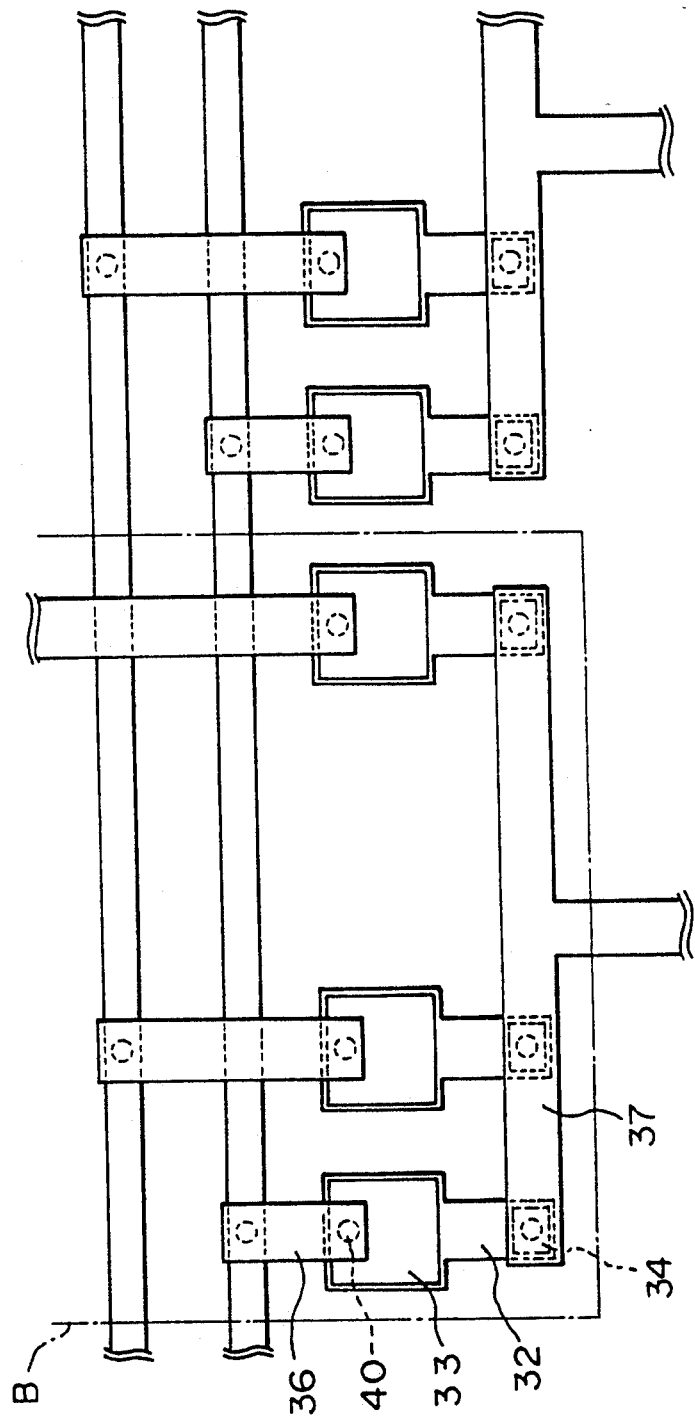
FIG. 14 is a diagram showing the connection pattern of the sensor elements.

FIG. 12 is a schematic connection diagram of the contact type image sensor of this embodiment, FIG. 13 is a detailed diagram of the sensor block, and FIG. 14 is a diagram showing a part of the connection pattern of the sensor element. In the contact type image sensor of this embodiment, 40 sensor blocks B each comprising 16 sensor elements 41 are arranged, and 40 input contact portions I connected to the input side of the respective sensor elements 41 and 16 output contact portions O connected to the output side of the respective sensor elements are arranged for driving the respective sensor elements. Each sensor element 41 comprises a photodiode 33 and a blocking diode 34, connected back to back as shown in FIG. 13, and the photodiode 33 and the blocking diode 34 are formed on the common lower electrode 32 so that their center axes coincide, as shown in FIG. 14. The BD upper electrode 37 provided on the surface of the blocking diode 34 opposed to the original A is formed so as to cover the whole upper surface of the blocking diode 34, as shown in FIG. 14.

The IC 42 for driving performs a successive reading through the total of 640 sensor elements 41 and the 16 output contact portions O and 40 input contact portions I.

The light emitted from the light source 44 passes through the slit 43a, is reflected from the original A, enters the sensor element 41, and is photoelectrically converted into an electrical signal by the sensor element 41. The IC 42 drives the sensor elements 41 through the input contact portions I, the output contact portions O, and the heat pressure adhered electroconductive seal 45, and reads the data accumulated by the sensor elements 41.

The light from the original A enters the photodiode 33 as such, but since the BD upper electrode is formed on the surface of the blocking diode 34 so as to cover the surface thereof, it is reflected against the BD upper electrode 37, and thus the contact type image sensor of this embodiment can form a common upper electrode 37 of the 16 blocking diodes 34 and the BD upper electrode 37 of the blocking diode 34, and at the same time, prevents an entry of incident light from the manuscript A to the blocking diode 34. In the contact type image sensor of the prior art, a light-shielding layer for light shielding is formed specially on the blocking diode 34, but according to this example, this light-shielding layer and the steps therefor are not required, and thus the production steps are simplified and the costs are reduced.

As described above, according to the present invention, since the entry of incident light from an original to the blocking diode can be prevented by the upper electrode formed at the upper part of the blocking diode, a contact type image sensor can be provided by which the entry of incident light from the original to the blocking diode can be prevented and the production steps are simplified.

We claim:

1. An amorphous silicon device, comprising an upper electrode, a lower electrode and an amorphous silicon layer between said upper and lower electrodes, said silicon layer having a peripheral surface dry etched so as to have dangling silicon bonds which create an electron conductive channel at said peripheral surface, said channel surrounding an inner portion of said silicon layer, at least one of said upper and lower electrodes overlapping only said inner portion.

2. An amorphous silicon device, comprising an upper electrode, a lower electrode and an amorphous silicon layer, each having a respective peripheral surface and being arranged along an axis with its peripheral surface surrounding said axis, said silicon layer between said upper end lower electrodes, the peripheral surface of said silicon layer being dry etched so as to have dangling silicon bonds creating an electroconductive channel, the peripheral surface of at least one of the upper and lower electrodes being formed radially inward of the peripheral surface of said silicon layer by a sufficient amount that an external voltage between the upper and lower electrodes is applied only in a volume of said silicon layer radially inward of said electroconductive channel.

3. An amorphous silicon device, comprising an upper electrode, a lower electrode and an amorphous silicon layer, each having a respective peripheral surface and being arranged along an axis with its peripheral surface surrounding said axis, said silicon layer between said upper and lower electrodes, the peripheral surface of at least one of said upper electrode and said lower electrode being located at least 1 $\mu$m radially inward of the peripheral surface of said silicon layer, the peripheral surface of said silicon layer being dry etched so as to have dangling silicon bonds creating an electroconductive channel.

4. An amorphous silicon device according to claim 3, wherein the peripheral surface of said at least one of said upper and lower electrodes is 1 to 2 $\mu$m radially inward of the peripheral surface of said silicon layer.

5. An amorphous silicon device according to claim 3 wherein the peripheral surfaces of said upper and lower electrodes are both at least 1 $\mu$m radially inward of the peripheral surface of said silicon layer.

6. An amorphous silicon device according to claim 3, wherein the peripheral surface of one said upper and lower electrodes is at least 1 $\mu$m radially inward of the peripheral surface of said silicon layer and the peripheral surface of the other of said upper and lower electrodes is aligned with the peripheral surface of said silicon layer.

7. An amorphous silicon device according to claim 3, wherein the amorphous silicon layer comprises layers of p-type amorphous silicon arranged so that the device forms an amorphous silicon diode.

8. An amorphous silicon device as claimed in claim 3, wherein said upper electrode is composed of a substance selected from the group consisting of ITO, $SnO_2$, Al, Cr, Mo, Ta and MoTa.

9. An amorphous silicon device as claimed in claim 3, wherein said lower electrode is composed of a substance selected from the group consisting of Cr, Mo, Ta and MoTa.

10. An amorphous silicon device as claimed in claim 3, wherein said amorphous silicon layer is composed of layers of p-, i- and n-types of amorphous silicon.

* * * * *